(12) United States Patent
Kanazawa et al.

(10) Patent No.: US 6,611,445 B2
(45) Date of Patent: Aug. 26, 2003

(54) CONTENT ADDRESSABLE MEMORY HAVING REDUNDANT CIRCUIT

(75) Inventors: Naoki Kanazawa, Chiba (JP); Ryuichi Hata, Chiba (JP)

(73) Assignee: Kawasaki Microelectronics, Inc., Chiba (JP)

(*) Notice: Subject to any disclaimer, the term of this patent is extended or adjusted under 35 U.S.C. 154(b) by 0 days.

(21) Appl. No.: 10/082,229

(22) Filed: Feb. 26, 2002

(65) Prior Publication Data

US 2002/0122337 A1 Sep. 5, 2002

(30) Foreign Application Priority Data

Mar. 1, 2001 (JP) ........................................ 2001-056392

(51) Int. Cl.[7] ................................................ G11C 7/00
(52) U.S. Cl. ......................................... 365/49; 365/200
(58) Field of Search ........................ 365/49, 200, 189.11

(56) References Cited

U.S. PATENT DOCUMENTS 6,275,406 B1 * 8/2001 Gibson et al. ................. 365/49

OTHER PUBLICATIONS

Tohru Miwa et al., "A 1–Mb 2–Tr/b Nonvolatile CAM Based on Flash Memory Technologies," IEEE Journal of Solid–State Circuits, vol. 31, No. 11, pp. 1601–1608, Nov. 1996.

* cited by examiner

Primary Examiner—Vu Anh Le
(74) Attorney, Agent, or Firm—Oliff & Berridge, PLC

(57) ABSTRACT

In a content addressable memory (CAM), a spare CAM word serving as a redundant circuit is mounted in addition to a plurality of CAM words, and a storage section for holding information indicating whether there is a defective CAM word in the plurality of CAM words, and if there is one or more defective CAM word, address information of the defective CAM word. Control is applied according to the address information of the defective CAM word such that the defective CAM word is replaced with the spare CAM word. The search output of the defective CAM word is replaced with that of the spare CAM word. The spare CAM word serving as a redundant circuit is mounted without increasing a circuit scale and an output delay time, and a produce yield is improved.

14 Claims, 11 Drawing Sheets

CONTENT ADDRESSABLE MEMORY HAVING REDUNDANT CIRCUIT

BACKGROUND OF THE INVENTION

1. Field of the Invention

The present invention relates to content addressable memories (CAMs), and more particularly, to a CAM having a function for substituting a spare CAM word for a defective CAM word.

2. Description of the Related Art

A CAM is a functional memory in which a search input data is compared with a vast amount of data stored therein at the same time, and the address of a matched word is output.

FIG. 8 is a block diagram showing address selection performed at a read/write access in a conventional CAM.

A CAM 54 shown in FIG. 8 is formed, for example, of a CAM array 56 having 256 CAM words (256 rows), a row decoder 58 for decoding address signals ADR[7:0], and a priority encoder 60 for sequentially encoding the address of a CAM word for which matching has been detected, according to a predetermined priority.

In the CAM 54 shown in FIG. 8, the row decoder 58 selects the CAM word corresponding to the address signals ADR[7:0] externally input, and a read/write access is performed for the stored data. A search operation between search data externally input and stored data stored in each CAM word is performed at the same time, and the priority encoder 60 sequentially outputs the address of a CAM word for which matching has been detected, according to a predetermined priority.

In semiconductor memories such as SRAMs and DRAMs, a redundant-circuit technique has been generally used, in which spare memory words are provided in advance as redundant circuits; if a defective memory word is found, the defective memory word is replaced with a spare memory word; and yield of the semiconductor memories is improved.

In CAMs, however, due to their special functions and circuit structures, such as their column structure largely different from that of usual semiconductor memories, and a function (encoding) for sequentially outputting a matched address according to the priority after searching, in addition to a function (decoding) for selecting an address in a data read/write access, a defective CAM word has hardly been substituted for.

As CAMs have been holding large capacities in these days, the development of CAMs which employ a redundant circuit has been started.

FIG. 9 is a block diagram showing address selection in a CAM which employs a redundant-circuit technique of an address conversion method.

The redundant-circuit technique is applied to a CAM 62 shown in FIG. 9. The CAM 62 is provided, in addition to the components of the CAM 54 shown in FIG. 8, with an FR pre-decoder 64, a logical-to-physical converter 66, a fail row decoder & fail row disable circuit 68, and a physical-to-logical converter 70.

In the CAM 62 shown in FIG. 9, a CAM array 56 has a CAM word R256 as one spare word in addition to usual 256 CAM words, R0, R1, . . . , and R255. The FR pre-decoder 64 stores a signal RD_EB indicating whether a defective CAM word exists, and if there is a defective CAM word, the address signals FA[7:0] of the defective CAM word.

When there is no defective CAM word (signal RD_EB= 0), the logical-to-physical converter 66 outputs the address signals ADR[7:0] as they are to the row decoder 58. When a defective CAM word is found (signal RD_EB=1), the address signals ADR[7:0] externally input and the address signals FA[7:0] of the defective CAM word are compared in magnitude.

As shown in FIG. 10A, when ADR[7:0]≧FA[7:0], the address signals ADR[7:0] are incremented by 1 and output to the row decoder 58 as signals P_ADR[8:0]. In other words, memory addresses are shifted downwards by one after the address of the defective CAM word. When ADR [7:0]<FA[7:0], the address signals ADR[7:0] are output to the row decoder 58 as they are.

The operations of the row decoder 58, the CAM array 56, and the priority encoder 60 is the same as those in the CAM 54 shown in FIG. 8 except that the address signals P_ADR [8:0] are input from the logical-to-physical converter 66 instead of the address signals ADR[7:0] externally input. The fail row decoder & fail row disable circuit 68 disables a detection result of matching or unmatching, output from the defective CAM word.

When there is no defective CAM word (signal RD_EB= 0), the physical-to-logical converter 70 outputs address signals P_HHA[7:0] input from the priority encoder 60 as they are. When a defective CAM word is found (signal RD_EB=1), the address signals P_HHA[8:0] input from the priority encoder 60 and the address signals FA[7:0] of the defective CAM word are compared in magnitude.

As shown in FIG. 10B, when P_HHA[8:0]≧FA[7:0], P_HHA[8:0] are reduced by 1 and output as signals HHA [7:0]. In other words, memory addresses are shifted upwards by one after the address of the defective CAM word. When P_HHA[8:0]<FA[7:0], the address signals P_HHA[7:0] are output as they are as signals HHA[7:0].

In other words, as shown in FIG. 11, in the CAM 62, when a CAM word P3 is defective, for example, the logical-to-physical converter 66 outputs memory addresses L0 to L2 of the address signals ADR externally input, as they are, and shifts memory addresses L3 to L6 downwards by 1. After encoding, the physical-to-logical converter 70 outputs memory addresses P0 to P2 as they are, and shifts memory addresses P4 to P7 upwards by 1.

Therefore, since addresses are increased, if necessary, at the input side (decoder side), and they are reduced contrarily at the output side (encoder side), an external interface can use the CAM 62 without taking a defective CAM word into consideration.

In the CAM 62, which uses the conventional redundant-circuit technique, however, since logical addresses (addresses externally input) and physical addresses (addresses actually used at the inside) are mutually converted by the use of the magnitude comparison circuits, the adder, and the subtracter, its circuit has a large scale and a complicated structure. In addition, the circuit 68 for disabling the match output of a defective CAM word is required. The CAM 62 has a large demerit of an increase in area due to the addition of a redundant circuit.

Further, since a magnitude comparison, an addition, and a subtraction are performed every time a read/write access of stored data and a search operation are performed, an output delay time is increased very much compared with that in the CAM 54, which is not provided with a redundant circuit. Especially, the delay time of the encoding output of a memory address after a match search operation is an important issue related to the specification of the CAM, although the delay time depends on the circuit structures of the magnitude comparison circuits, the adder, and the subtracter.

SUMMARY OF THE INVENTION

It is an object of the present invention to provide a content addressable memory (CAM) which solves the problems caused by the conventional technique, which has a spare CAM word as a redundant circuit without increasing a circuit scale and an output delay time, and which can improve a product yield.

The foregoing object is achieved in one aspect of the present invention through the provision of a content addressable memory (CAM) including a plurality of CAM words; one or more spare CAM word serving as a redundant circuit; a defective-CAM-word address storage section for holding information indicating whether there is one or more defective CAM word in the plurality of CAM words, and if there is one or more defective CAM word, address information of the defective CAM word; a shift control circuit for controlling such that the addresses of CAM words located at lower-order addresses than the defective CAM word are shifted in a lower-order direction or in an higher-order direction by the use of the spare CAM word, according to the address information of the defective CAM word, held in the defective-CAM-word address storage section; a first shift circuit for shifting the addresses of CAM words located at lower-order addresses than i-th (i: integer equal to 1 or more) defective CAM word in the lower-order direction by "i" according to the control of the shift control circuit at a read/write access of data; and a second shift circuit for shifting the addresses of the CAM words located at lower-order addresses than the i-th defective CAM word in the higher-order direction by "i" according to the control of the shift control circuit at a search operation.

Since an lower order and a higher order are relative to each other, the above content addressable memory may be configured such that "lower order" is replaced with "higher order" and "higher order" is replaced with "lower order."

The foregoing object may also be achieved by the present invention through the provision of a content addressable memory (CAM) including a plurality of CAM words; one or more spare CAM word serving as a redundant circuit; a defective-CAM-word address storage section for holding information indicating whether there is one or more defective CAM word in the plurality of CAM words, and if there is one or more defective CAM word, address information of the defective CAM word; a first shift control circuit for controlling so as to shift the addresses of the CAM words located at lower-order addresses than the defective CAM word in the lower-order direction by the use of the spare CAM word, according to the address information of the defective CAM word, held in the defective-CAM-word address storage section; a first shift circuit for shifting the addresses of CAM words located at lower-order addresses than i-th (i: integer equal to 1 or more) defective CAM word in the lower-order direction by "i" according to the control of the first shift control circuit at a read/write access of data; a second shift control circuit for controlling so as to shift the addresses of the CAM words located at lower-order addresses than the defective CAM word in the higher-order direction by the use of the spare CAM word, according to the address information of the defective CAM word, held in the defective-CAM-word address storage section; and a second shift circuit for shifting the addresses of the CAM words located at lower-order addresses than the i-th defective CAM word in the higher-order direction by "i" according to the control of the second shift control circuit at a search operation.

The above content addressable memory may also be configured such that "lower order" is replaced with "higher order" and "higher order" is replaced with "lower order."

DESCRIPTION OF THE PREFERRED EMBODIMENTS

A content addressable memory (CAM) according to a preferred embodiment of the present invention will be described below in detail by referring to the attached drawings.

Figure 1:
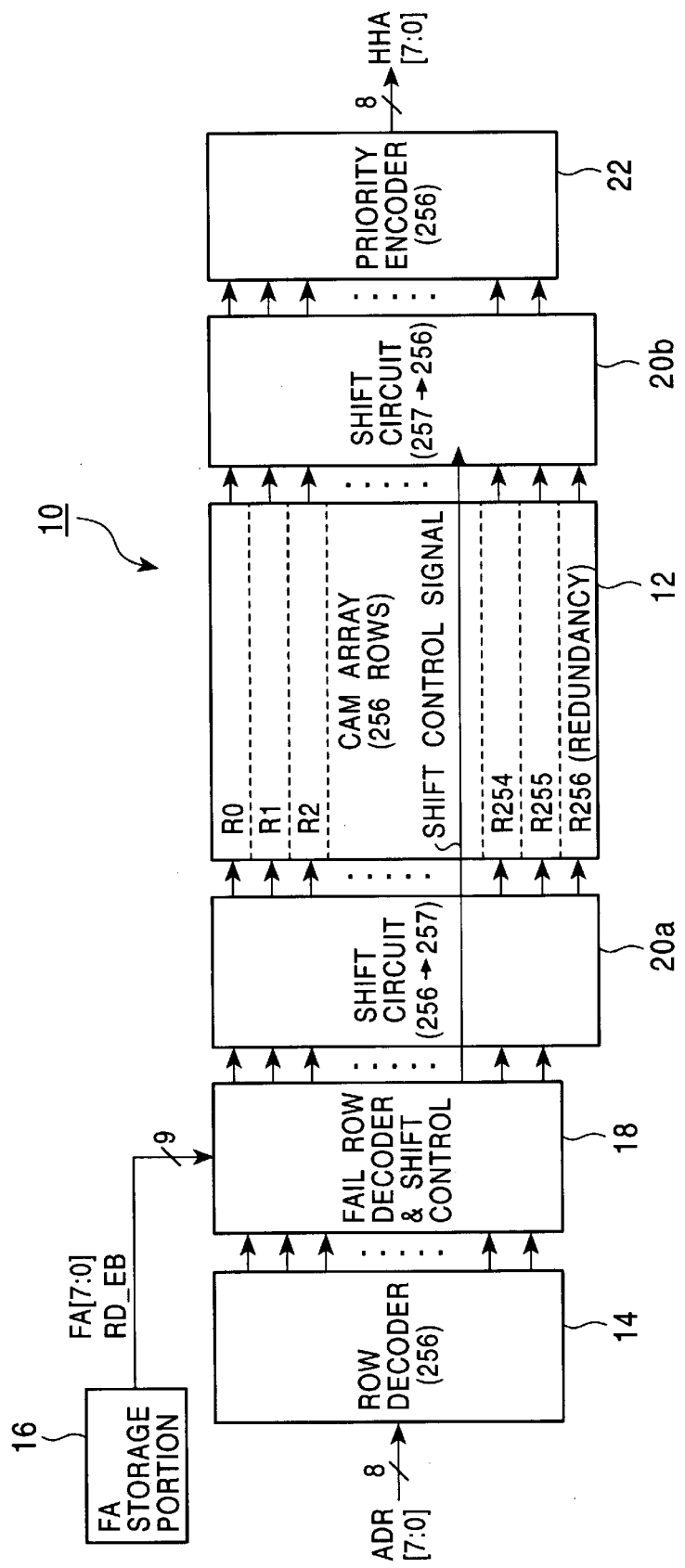
FIG. 1 is a block diagram showing address selection in a CAM according to an embodiment of the present invention.

FIG. 1 is a block diagram showing address selection in a CAM according to an embodiment of the present invention.

A CAM 10 shown in FIG. 1 has a function for substituting a spare CAM word serving as a redundant circuit for a defective CAM word, and is provided with a CAM array 12, a row decoder 14, a fail address storage portion (defective-CAM-word address storage section) 16, a fail row decoder & shift control circuit (hereinafter called an FRD & SC circuit) 18, two shift circuits 20a and 20b, and a priority encoder 22.

Figure 9:
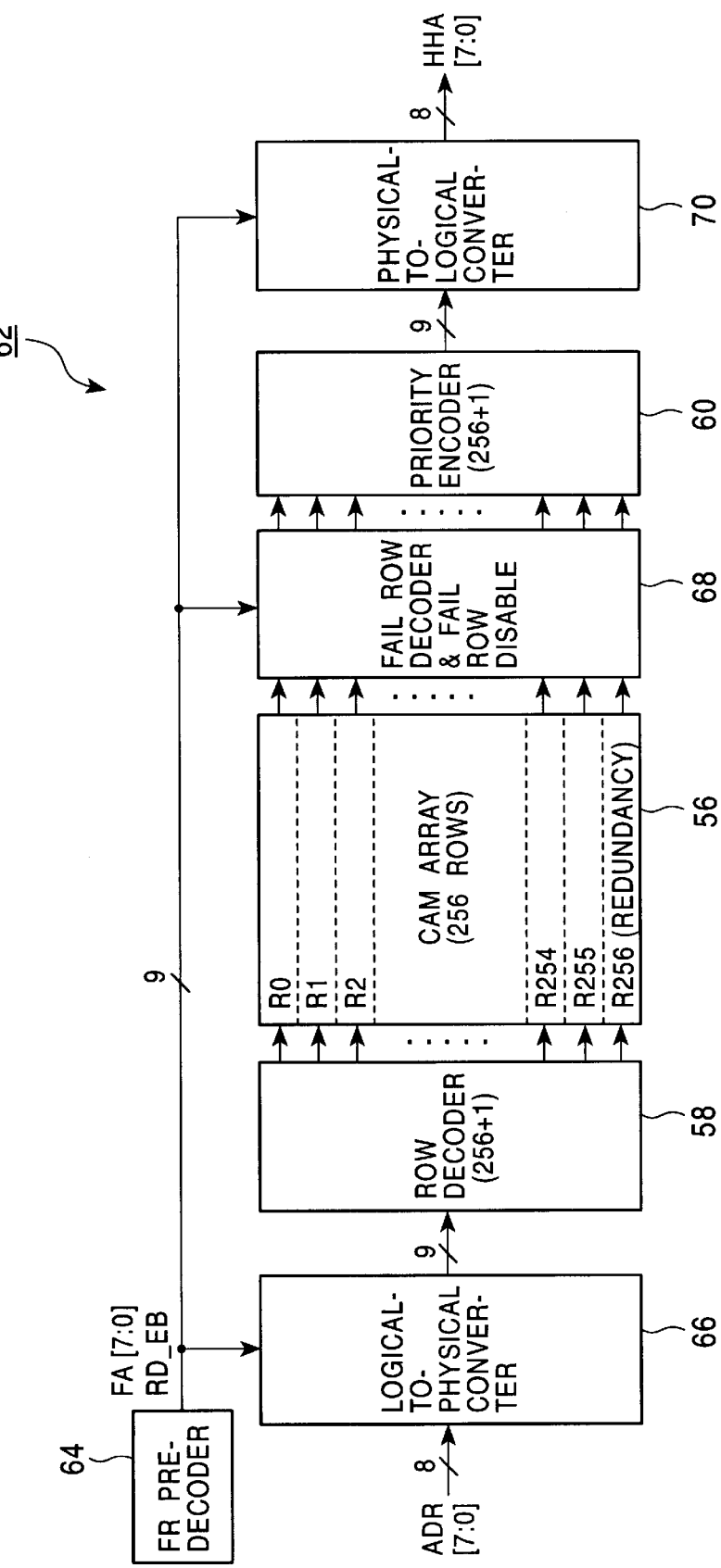
FIG. 9 is a block diagram showing address selection in a conventional CAM which employs a redundant-circuit technique of an address conversion method.
Figure 10A:
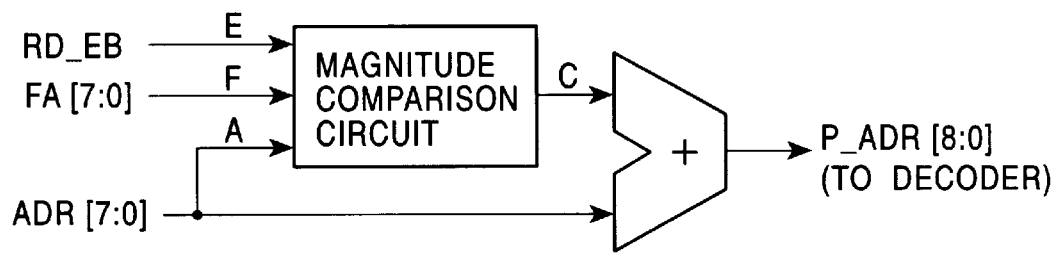
FIG. 10A is a block diagram of a magnitude comparison circuit and an adder used in the CAM shown in FIG. 9.
Figure 10B:
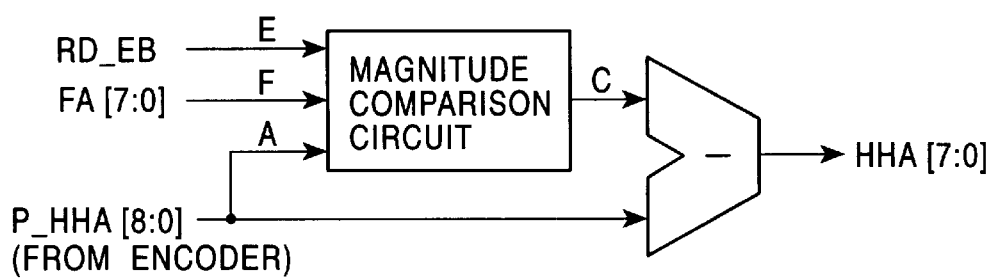
FIG. 10B is a block diagram of a magnitude comparison circuit and a subtracter used in the CAM shown in FIG. 9.
Figure 11:
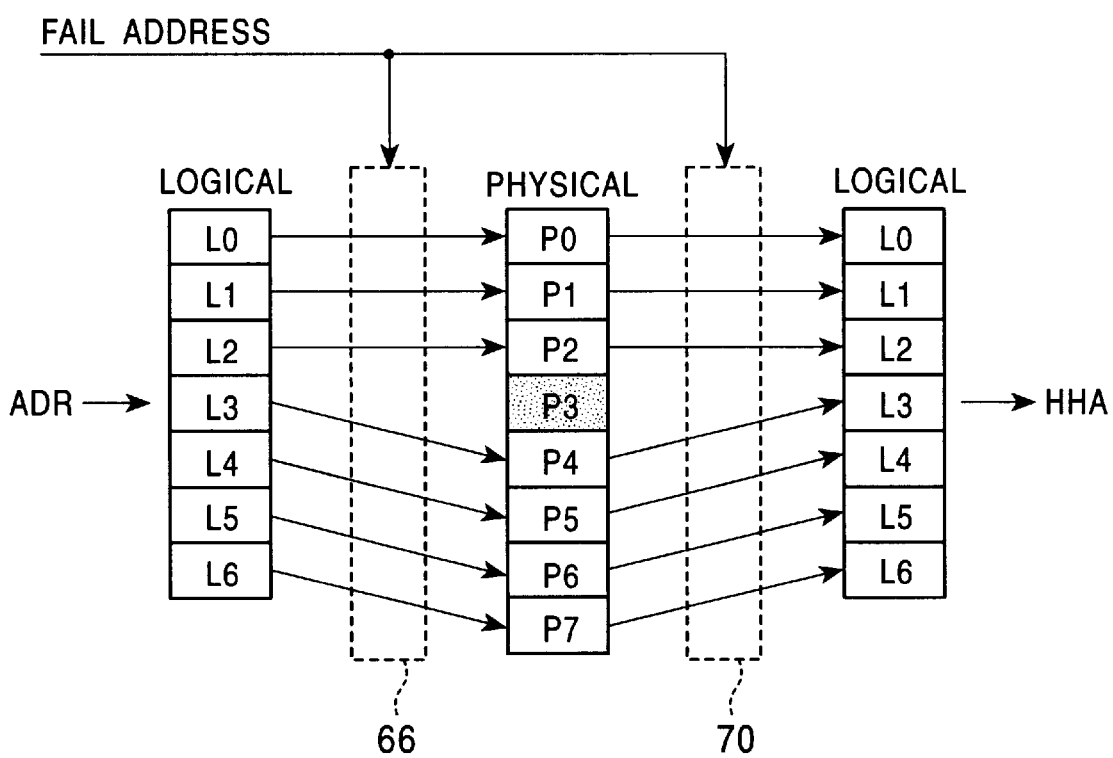
FIG. 11 is a view showing the operation of the CAM shown in FIG. 9.

In the CAM 10 shown in FIG. 1, the CAM array 12 has, for example, a CAM word R256 as one spare word in addition to usual 256 (256-row) CAM words, R0, R1, . . . , and R255, specified by consecutive addresses. In the present embodiment, to facilitate a comparison with the conventional CAM 62 shown in FIG. 9, a case in which a CAM array having the same number of words as that of the CAM 62 is used will be taken as an example.

In the present embodiment, the CAM word R0 is the highest-order CAM word, CAM words R1, R2, R3, . . . sequentially indicate lower-order CAM words, and the CAM word R255 is the lowest-order CAM word. The order of words in the present invention is not limited to this case. The CAM array 12 may be configured such that the CAM word RO is the lowest-order CAM word, CAM words R1, R2, R3, sequentially indicate higher-order CAM words, and the CAM word R255 is the highest-order CAM word.

The row decoder 14 decodes a logical address, namely, address signals ADR[7:0] externally input to output a word selection signal for specifying the CAM word corresponding to the address. The row decoder 14 has 256 word selection signals corresponding to CAM words R0, R1, . . . , and R255, and sets one word selection signal corresponding to the address signals ADR[7:0] to an active state.

The fail address storage portion 16 holds information indicating whether there is a defective CAM word, and if there is a defective CAM word, holds the address of the defective CAM word. The fail address storage portion 16 outputs a signal RD_EB indicating whether there is a defective CAM word and signals FA[7:0] indicating the address of a defective CAM word.

The fail address storage portion 16 may be structured with fuses such that a fuse is blown according to the address of a defective CAM word to specify the address, or may be provided with an internal register such that the internal register holds the address of a defective CAM word. The fail address storage portion 16 needs to specify the address of a defective word, and is not limited to any means. Any conventionally known means can be used.

The FRD & SC circuit 18 outputs a shift control signal for controlling the operations of the shift circuits 20a and 20b such that the addresses of CAM words located at lower-order addresses than a defective CAM word are shifted in a lower-order direction or in a higher-order direction with the use of a spare CAM word, according to the signal RD_EB and the signals FA[7:0]. In the present embodiment, the shift control signal is input to both shift circuits 20a and 20b, and the FRD & SC circuit 18 is shared by the shift circuits 20a and 20b.

According to the shift control signal, the shift circuit 20a at the decoder side outputs the 256 word selection signals sent from the row decoder 14 through the FRD & SC circuit 18, as they are, or shifts the word selection signals corresponding to all CAM words having lower-order addresses than the defective CAM word to the CAM words having lower-order addresses by one, namely, shifts the addresses of all CAM words located at lower-order addresses than the defective CAM word, in a lower-order-address direction.

On the other hand, according to the shift control signals, the shift circuit 20b at the encoder side outputs 256 search output signals at higher-order addresses among 257 search output signals input through match lines from the CAM words of the CAM array 12, as they are, or shifts the search output signals corresponding to all CAM words having lower-order addresses than the defective CAM word to the CAM words having higher-order addresses by one, namely, shifts the addresses of all CAM words located at lower-order addresses than the defective CAM word, in a higher-order-address direction.

When there is no defective CAM word (signal RD_EB=0), the logical addresses of the CAM words match the physical addresses thereof. In other words, the 256 word selection signals output from the row decoder 14 are input to the corresponding CAM words R0, R1, . . . , and R255 as they are, and the search output signals output from the CAM words R0, R1, . . . , and R255 are input to the priority encoder 22 as they are.

In contrast, when there is a defective CAM word (signal RD_EB=1), the word selection signals corresponding to all CAM words located at lower-order addresses than the defective CAM word are shifted to the CAM words located at lower-order addresses by one, according to the signals FA[7:0]. The search output signals corresponding to all the CAM words located at lower-order addresses than the defective CAM word are shifted to the CAM words located at higher-order addresses by one.

The priority encoder 22 sequentially encodes the address of a CAM word for which matching has been detected, according to a predetermined priority by the use of the 256 search output signals input from the shift circuit 20b, and sequentially outputs it as the highest hit address HHA[7:0]. The priority of CAM words is not limited. CAM words located at lower-order addresses or higher-order addresses may have higher priority.

The number of words in the CAM array or the number of bits in one word is not limited. Any number of spare CAM words may be provided. In the case shown in the figure, a spare CAM word is located at the lowest-order memory address. It may be disposed at the highest-order memory address, or at any other memory address. The row decoder 14 and the priority encoder 22 can use conventionally known structures.

When two or more spare CAM words are provided, it is necessary that the shift circuit 20a at the decoder side shift the addresses of CAM words located at lower-order addresses than a first defective CAM word in lower-order-address direction by one, shift the addresses of CAM words located at lower-order addresses than a second defective CAM word in lower-order-address direction by two, and shift the addresses of CAM words located at lower-order addresses than an i-th (i: integer equal to 1 or more) defective CAM word in lower-order-address direction by "i."

When two or more spare CAM words are provided, it is necessary that the shift circuit 20b at the encoder side shift the addresses of CAM words located at lower-order addresses than the first defective CAM word in higher-order-address direction by one, shift the addresses of CAM words located at lower-order addresses than the second defective CAM word in higher-order-address direction by two, and shift the addresses of CAM words located at lower-order addresses than the i-th defective CAM word in higher-order-address direction by i.

When two or more spare CAM words are provided, CAM words may be shifted by two with defective words collectively handled. In this case, the addresses of CAM words are shifted in a lower-order-address direction by two at the decoder side, and the addresses of CAM words are shifted in a higher-order-address direction by two at the encoder side. When three or more spare CAM words are provided, the same condition applies. When "i" or more spare CAM words are provided, CAM words may be shifted by "i" with defective words collectively handled. In this case, the addresses of CAM words are shifted in a lower-order-address direction by "i" at the decoder side, and the addresses of CAM words are shifted in a higher-order-address direction by "i" at the encoder side.

The FRD & SC circuit 18 and the two shift circuits 20a and 20b shown in FIG. 1 will be described below in detail.

Figure 2:
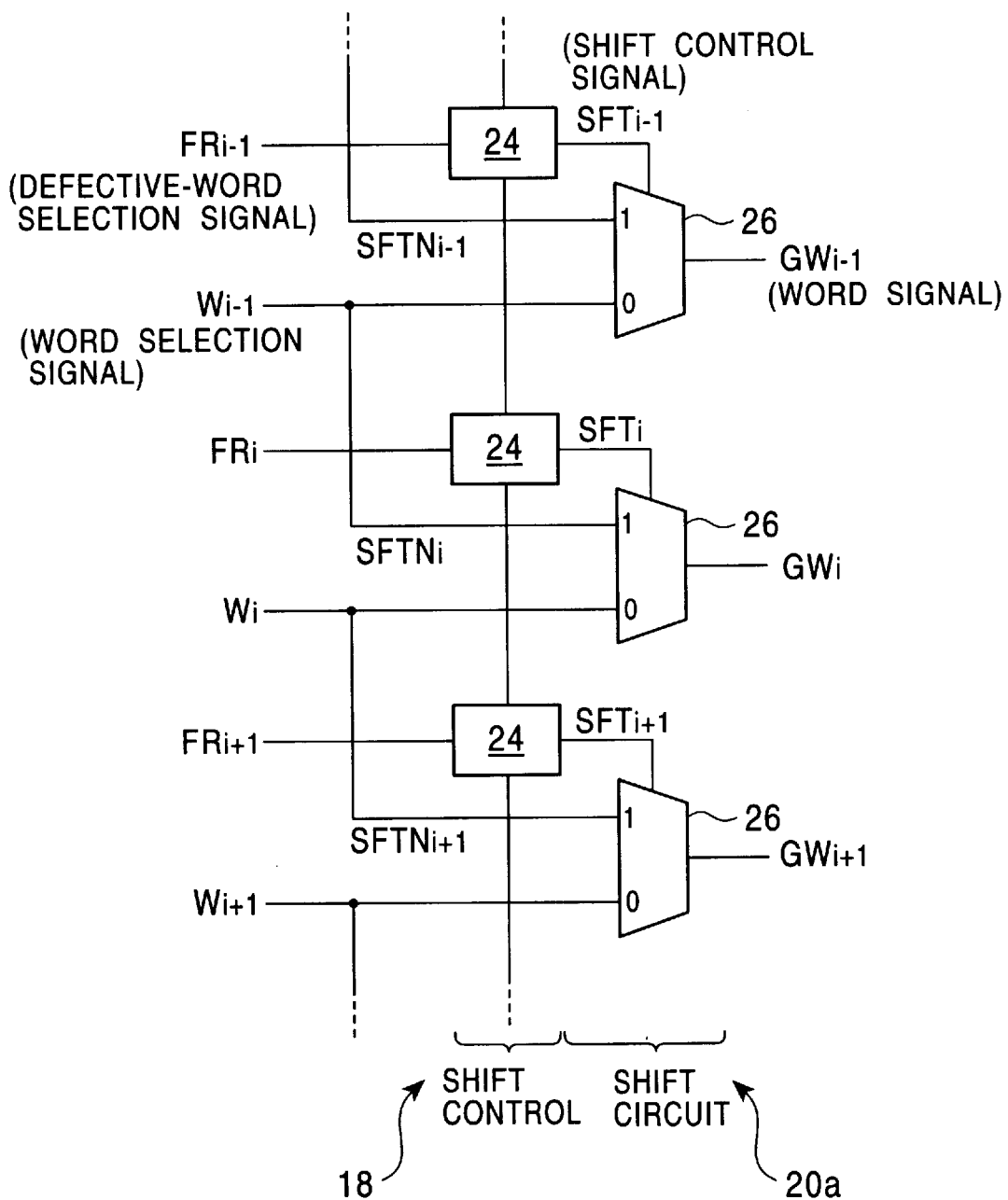
FIG. 2 is a block diagram of a fail row decoder & shift control circuit and a shift circuit at a decoder side, used in the CAM according to the embodiment of the present invention.

FIG. 2 is a block diagram of the FRD & SC circuit and the shift circuit at the decoder side, used in the CAM according to the present invention. As shown in FIG. 2, the FRD & SC circuit 18 is provided with a control circuit 24 corresponding to each defective-CAM-word selection signal FRi. The shift circuit 20a at the decoder side is provided with a selector 26 corresponding to each of CAM words R0, R1, . . . , and R256.

Each control circuit 24 of the FRD & SC circuit 18 receives the corresponding defective CAM word selection signal FRi and the inverted signal SFTNi of a shift control signal output from the foregoing control circuit (control circuit corresponding to a defective CAM word selection signal at the one-word higher-order address) 24. A shift control signal SFTi output from each control circuit 24 is input to a selection terminal of the corresponding selector 26 in the shift circuit 20a.

A defective CAM word selection signal FRi is obtained by decoding signals FA[7:0] indicating the address of a defective CAM word. In the present embodiment, when there is no defective CAM word, all defective CAM word selection signals FRi are set to an inactive state (FRi=1), and when there is one defective CAM word, only one defective CAM word selection signal FRi is set to an active state (FRi=0).

Each selector 26 in the shift circuit 20a receives a word selection signal Wi of the corresponding CAM word among the CAM words R0, R1, . . . , and R256, and a word selection signal $W_{i-1}$, corresponding to the CAM word located at the one-word higher-order address. As described above, the shift control signal SFTi is input from the corresponding control circuit 24 to the selection terminal of the selector 26. The output signal GWi of the selector 26 is input to the corresponding CAM word.

When there is no defective CAM word, the shift control signal SFTi output from each control circuit 24 is "0" in the FRD & SC circuit 18. Therefore, the shift circuit 20a outputs the word selection signal Wi corresponding to a CAM word Ri from each selector 26 as a word signal GWi.

In contrast, when there is a defective CAM word, the shift control signals SFTi output from the control circuits 24 corresponding to all defective CAM word selection signals FRi at lower-order addresses, including FRi being set to "0," are set to "1." Therefore, each selector 26 outputs the word selection signal $W_{i-1}$ corresponding to the CAM word located at the one-word higher-order address, as the word signal $GW_i$.

Figure 3:
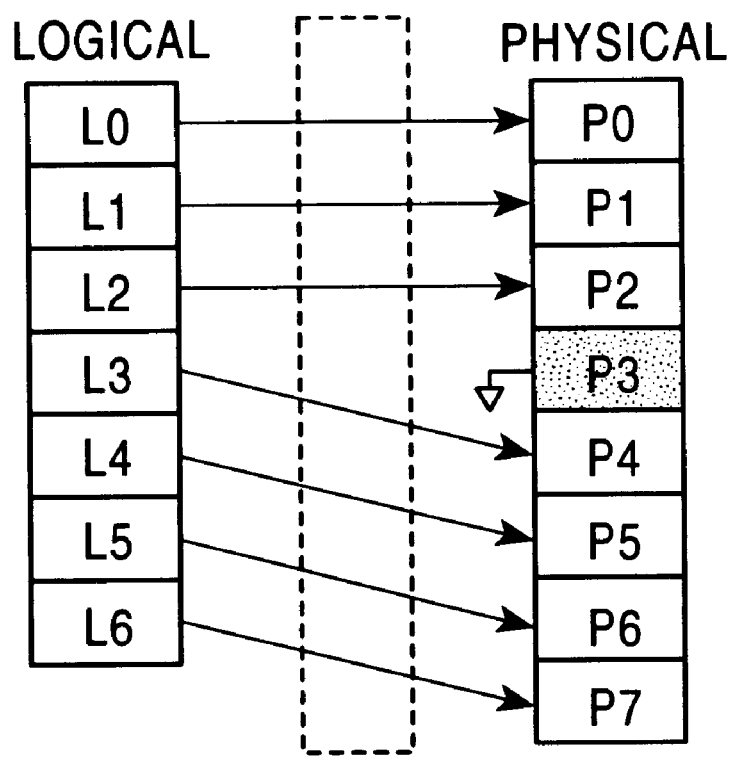
FIG. 3 is a view showing the operation of the circuits shown in FIG. 2.

More specifically, as shown in FIG. 3 in an easy-to-understand manner, when it is assumed that there are CAM words P0 to P6 and a spare CAM word P7, for example, if the CAM word P3 is a defective CAM word, the CAM words P0 to P2 receive the corresponding word selection signals L0 to L2, respectively, the word line of the defective CAM word P3 is fixed to a low level, and the CAM words P4 to P7 receive word selection signals L3 to L6, which are shifted by one in a lower-order direction.

The FRD & SC circuit and the shift circuit at the decoder side will be described below further in detail by taking a specific case shown in FIG. 4A and FIG. 4B as an example.

Figure 4A:
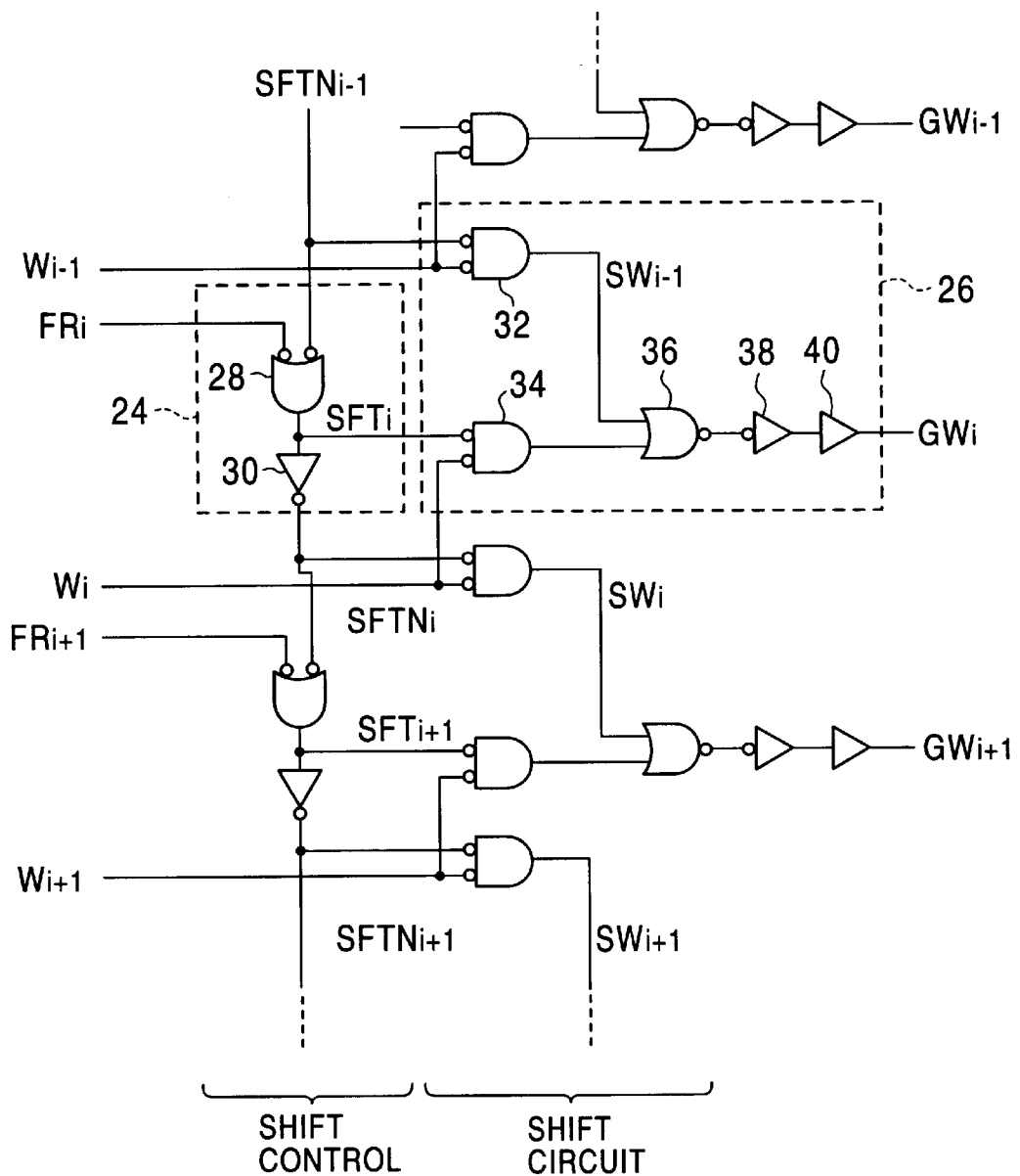
FIG. 4A is a circuit diagram of a row decoder, the fail row decoder & shift control circuit, and the shift circuit at the decoder side, used in the CAM according to the embodiment of the present invention.

As shown in FIG. 4A, each control circuit 24 in the FRD & SC circuit 18 is formed of an OR gate (functions as a NAND gate) 28 and an inverter 30. To two inverting input terminals of the OR gate 28, the corresponding defective CAM word selection signal FRi and the signal $SFTN_{i-1}$ output from the foregoing control circuit 24 are input. A signal SFTi is output from the OR gate 28 and its inverted signal SFTNi is output through the inverter 30.

Each selector 26 in the shift circuit 20a at the decoder side is formed of two AND gates (both function as NOR gates) 32 and 34, a NOR gate 36, an inverter 38, and a buffer 40. To two inverting input terminals of the AND gate 34, the word selection signal Wi corresponding to a CAM word Ri and the shift control signal SFTi output from the OR gate 28 of the corresponding control circuit 24 are input. To two inverting input terminals of the AND gate 32, the word selection signal $W_{i-1}$, corresponding to the CAM word $R_{i-1}$ located at a one-word higher-order address and the inverted signal $SFTN_{i-1}$ of the shift control signal output from the inverter 30 of the foregoing control circuit 24 are input. The output signals of the AND gates 32 and 34 are input to the NOR gate 36. The output signal of the NOR gate 36 is output through the inverter 38 and the buffer 40 as a word signal $GW_i$.

In the circuit shown in FIG. 4A, when there is no defective CAM word, all defective CAM word selection signals FRi, obtained by decoding the signals FA[7:0], are in a high level. When there is no defective CAM word, the inverted signal SFTN0 of a shift control signal for the highest-order address is in the high level, the output signals SFTi of the OR gates 28 are in the low level, and the output signals $SFTN_1$ of the inverters 30 are in the high level.

Therefore, since the output signal of the AND gate 32, to which the signal $SFTN_{i-1}$ is input, is in the low level, the AND gate 34, to which the signal SFTi is input, outputs the word selection signal Wi output from the row decoder 14, and the signal is output through the NOR gate 36, the inverter 38, and the buffer 40 as the word signal GWi.

When there is a defective CAM word, only the defective CAM word selection signals FRi (i: any one numeral between 0 and 255) obtained by decoding the signals FA[7:0] is in the low level. The shift control signals SFTi corresponding to all CAM words located at lower-order addresses than the CAM word corresponding to FRi, plus this CAM word, are all in the high level, and their inverted signals $SFTN_1$ are all in the low level.

Therefore, the selector 26 corresponding to each of all CAM words located at lower-order addresses than the CAM word corresponding to the low-level defective CAM word selection signal, plus this CAM word, outputs the word selection signal $W_{i-1}$ corresponding to the CAM word located at the one-word higher-order address as the word signal GWi.

In the selector 26 corresponding each of all CAM words located at higher-order addresses than the CAM word corresponding to the low-level FRi, the signal SFTi is in the low level, and the signal SFTNi remains in the high level. Therefore, the selector 26 corresponding each of all CAM words located at higher-order addresses than the CAM word corresponding to the low-level FRi operates exactly the same way as when there is no defective CAM word.

Figure 4B:
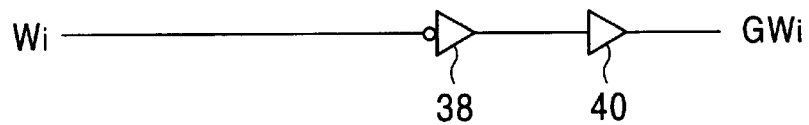
FIG. 4B is a circuit diagram of a conventional row decoder.

FIG. 4B is a circuit diagram of a conventional row decoder.

FIG. 4B shows a row decoder for one word, used in a conventional CAM to which a redundant-circuit technique is not applied, in order to make the scale of an additional circuit according to the present invention easier to understand. In FIG. 4B, an inverter 38 and a buffer 40 correspond to the inverter 38 and the buffer 40 shown in the circuit according to the present invention, illustrated in FIG. 4A.

Figure 8:
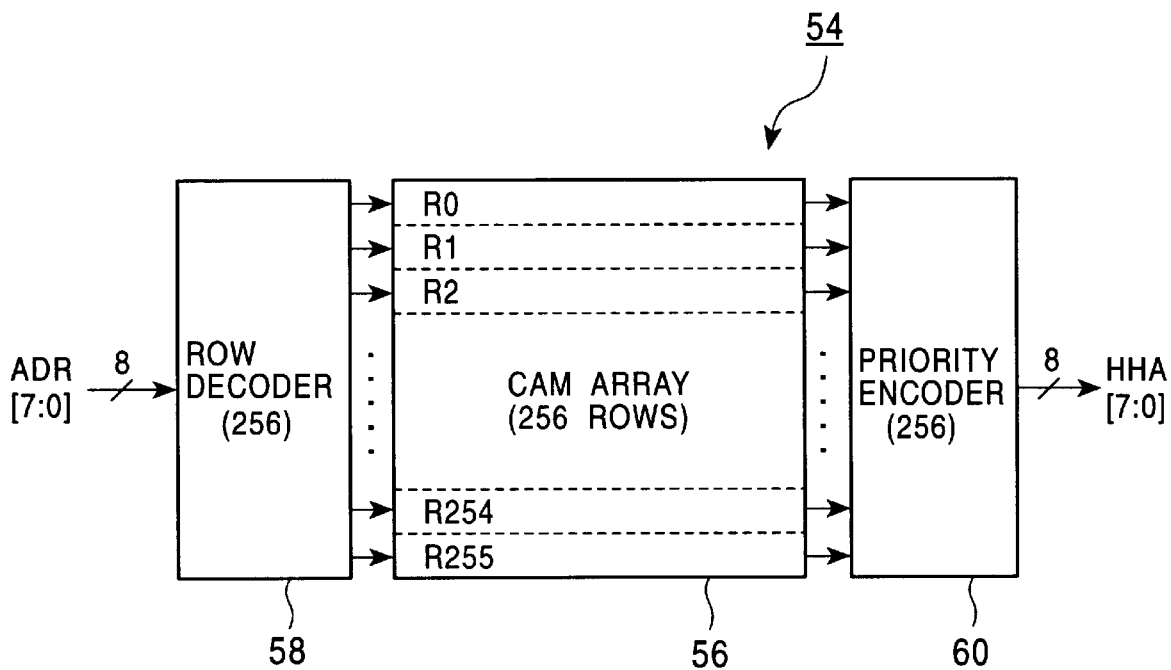
FIG. 8 is a block diagram showing address selection in a conventional CAM.

It is clear from a comparison between the circuits shown in FIG. 4A and FIG. 4B that only the OR gate 28 and the inverter 30, which correspond to the control circuit 24, and the two AND gates 32 and 34 and the NOR gate 36, which correspond to the selector 26, are added to obtain the circuit according to the present invention. These components are added, for example, to the conventional CAM shown in FIG. 8, and their circuit scale is much more smaller and their output delay time is extremely shorter than the circuit added to the conventional CAM, shown in FIG. 9.

Figure 5:
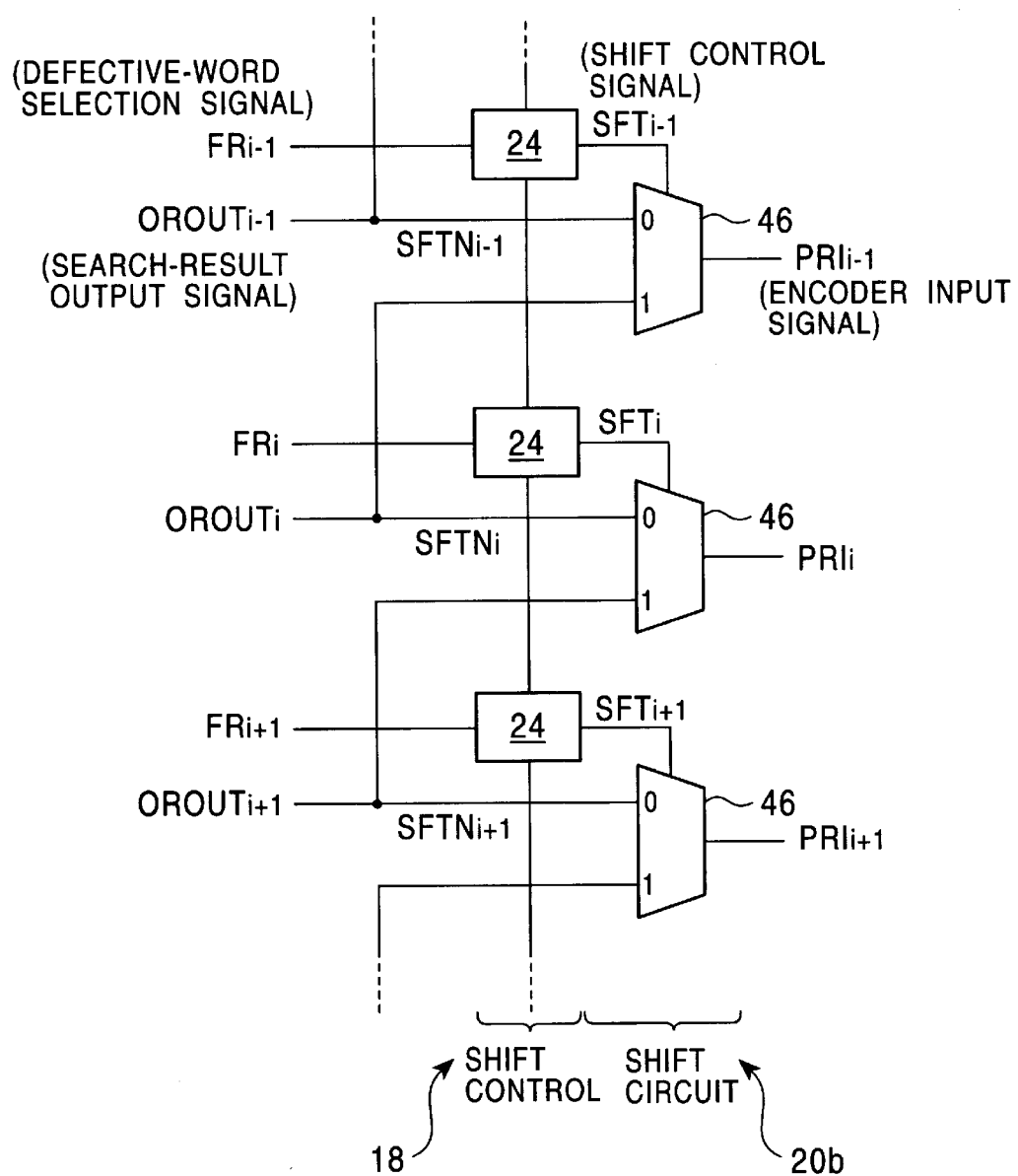
FIG. 5 is a block diagram of a fail row decoder & shift control circuit and a shift circuit at an encoder side, used in a CAM according to the present invention.

FIG. 5 is a block diagram of an FRD & SC circuit and a shift circuit at an encoder side, used in a CAM according to the present invention. As shown in FIG. 5, the FRD & SC circuit 18 has the same structure as that shown in FIG. 2. The shift circuit 20b at the encoder side is provided with a selector 46 corresponding to each of CAM words R0, R1, and R255.

In the case shown in FIG. 5, to facilitate understanding, the FRD & SC circuit 18 is also provided before the shift circuit 20b at the encoder side. The FRD & SC circuit 18 may be separately provided for each of the shift circuits 20a and 20b at the decoder side and the encoder side. As shown in FIG. 1, the FRD & SC circuit 18 may be shared by the shift circuits 20a and 20b by drawing and connecting the shift control signal SFTi and its inverted signal SFTNi.

In the shift circuit 20b shown in FIG. 5, a search result output signal OROUT, corresponding to each of CAM words, R0, R1, . . . , and R256, and a search result output signal $OROUT_{i+1}$ corresponding the CAM word located at the one-word lower-order address are input to each selector 46. To the selection terminal of each selector 46, the corresponding shift control signal SFTi is input. The output signal PRli of each selector 46 is input to the priority encoder 22.

The FRD & SC circuit 18 operates as described before. More specifically, when there is no defective CAM word, the shift control signal SFTi output from each control circuit 24 is in an inactive state. Therefore, in the shift circuit 20b, each selector 46 outputs the search result output signal OROUTi corresponding to each CAM word Ri as the signal PRli.

When there is a defective CAM word, the shift control signals SFTi output from the control circuits 24 corresponding to all defective CAM word selection signals FRi at lower-order addresses than the defective CAM word selection signal FRi which is in an active state are set to the active state. Therefore, each selector 46 outputs the search result output signal $OROUT_{i+1}$ corresponding to the CAM word located at the one-word lower-order address, as the signal PRli.

Figure 6:
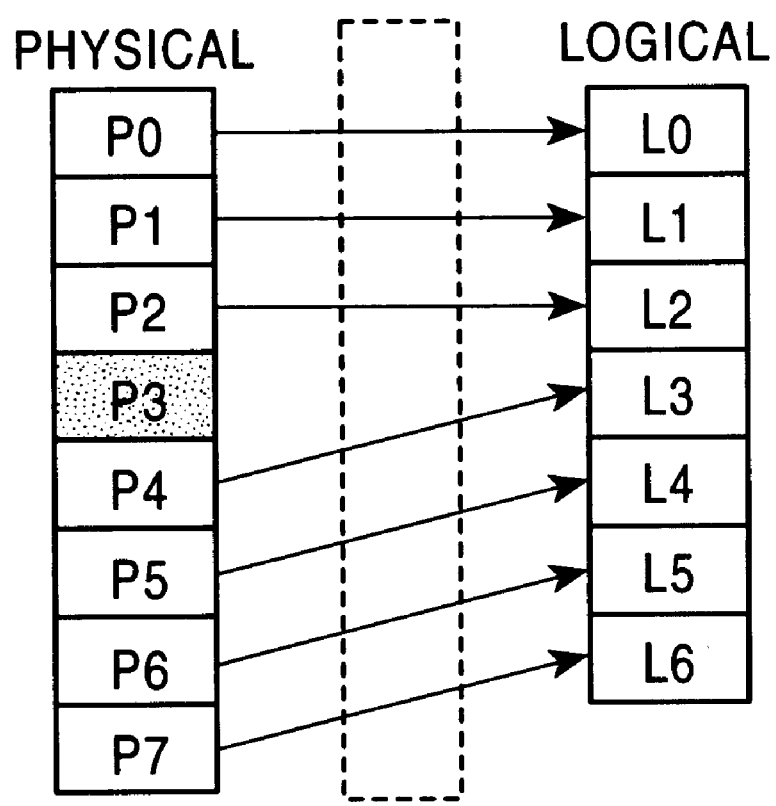
FIG. 6 is a view showing the operation of the circuits shown in FIG. 5.

More specifically, as shown in FIG. 6 in an easy-to-understand manner, when it is assumed that there are CAM words P0 to P6 and a spare CAM word P7, for example, if the CAM word P3 is a defective CAM word, the search result output signals of the CAM words P0 to P2 are output as they are as the signals L0 to L2, respectively, the search result output signal of the defective CAM word P3 is ignored, and the search result output signals of the CAM words P4 to P7 are shifted by one in a higher-order direction and output as the signals L3 to L6.

The FRD & SC circuit and the shift circuit at the encoder side will be described below further in detail by taking a specific case shown in FIG. 7A and FIG. 7B as an example.

Figure 7A:
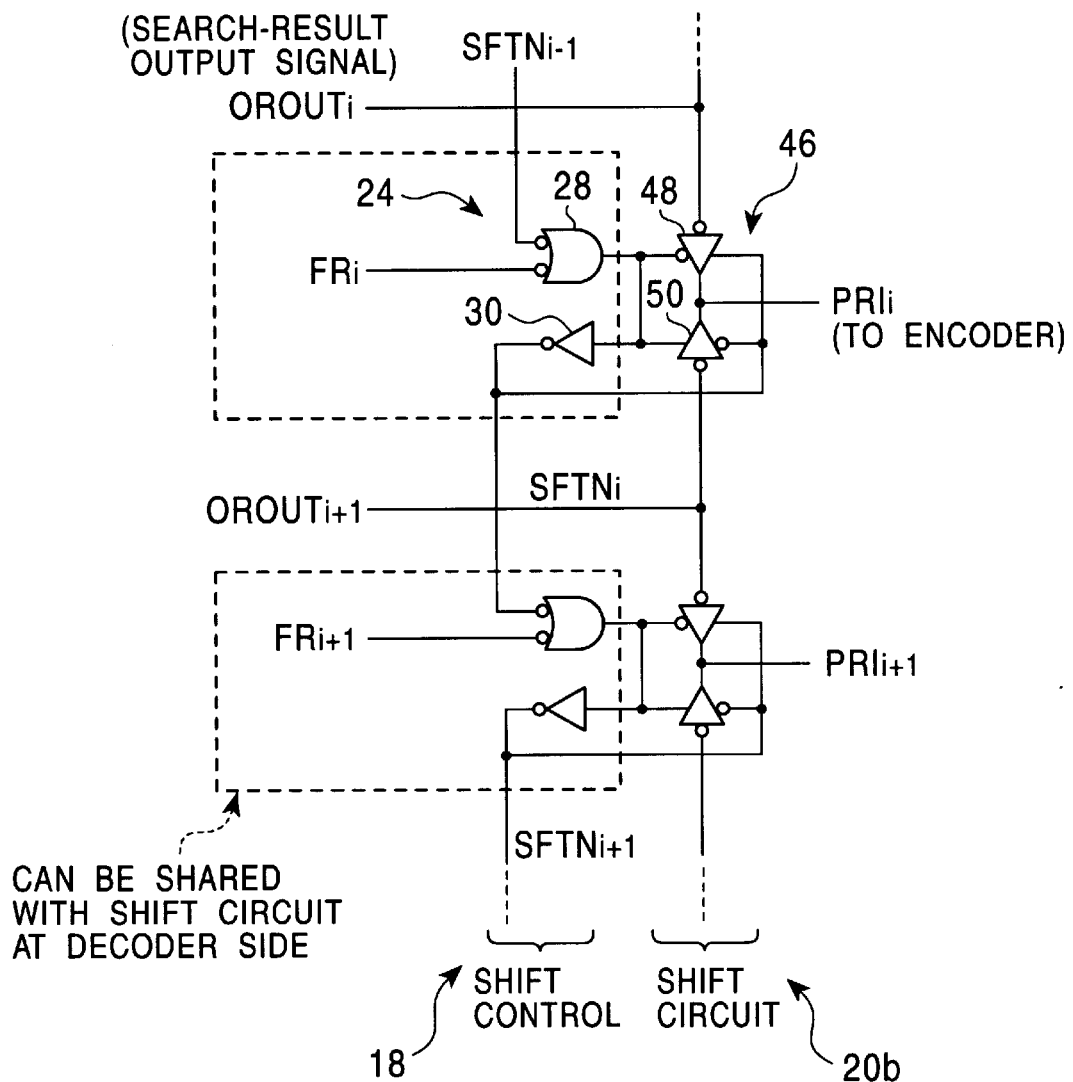
FIG. 7A is a circuit diagram of the fail row decoder & shift control circuit, and the shift circuit at the decoder side, used in the CAM according to the embodiment of the present invention.

As shown in FIG. 7A, each control circuit 24 in the FRD & SC circuit 18 is the same as that shown in FIG. 4A. Therefore, as described before, portions enclosed by dotted lines in FIG. 7A can be shared with the shift circuit 20a at the decoder side. As shown in FIG. 1, the shift control signal SFTi and its inverted signal SFTNi may be drawn from the FRD & SC circuit 18 and connected.

Each selector 46 in the shift circuit 20b at the encoder side is formed of two tristate inverters 48 and 50. The tristate inverter 48 receives the search result output OROUTi of the corresponding CAM word, and the tristate inverter 50 receives the search result output $OROUT_{i+1}$ of the CAM word located at the one-word lower-order address. The output signals of both tristate inverters are wire-connected to output the signal PRli.

To the inverting input control terminal of the tristate inverter 48 and to the input control terminal of the tristate inverter 50, the corresponding signal SFTi (the output signal of the OR gate 28) is input. To the input control terminal of the tristate inverter 48 and to the inverting input control terminal of the tristate inverter 50, the corresponding inverted signal SFTNi is input. In other words, only one of the inverters is turned on and the other is turned off according to the states of the signal SFTi and the signal SFTNi.

In the circuit shown in FIG. 7A, when there is no defective CAM word, signals FRi are all in the high level, as already described. A signal SFTN0 for the highest-order address is in the high level, the output signals SFTi of the OR gates 28 are in the low level, and the output signals SFTNi of the inverters 30 are all in the high level.

Therefore, the search result output OROUTi of each CAM word is output as the signal PRli.

When there is a defective CAM word, also as already described, only the defective CAM word selection signal FRi obtained by decoding the signal FA[7:0] is in the low level. Therefore, all the signals SFTi of CAM words located at lower-order addresses than the CAM word corresponding to the signal FRi, are in the high level, and the corresponding signals SFTNi are all in the low level.

Consequently, in each of the selectors 46 corresponding to all CAM words located at lower-order addresses than that for the low-level signal FRi, since the tristate inverter 50 in which the signal SFTi is input to the input control terminal thereof is turned on and the tristate inverter 48 in which the signal SFTNi is input to the input control terminal is turned off, the search result output $OROUT_{i+1}$ of the CAM word located at the one-word lower-order address is output as the signal PRli.

In each of the selectors 46 corresponding to all CAM words located at higher-order addresses than that for the low-level signal FRi, the signal SFTi is in the low level and the signal SFTNi is in the high level. Therefore, each of the selectors 46 corresponding to all CAM words located at higher-order addresses than that for the low-level signal FRi operates in the same way as when there is no defective CAM word.

Figure 7B:
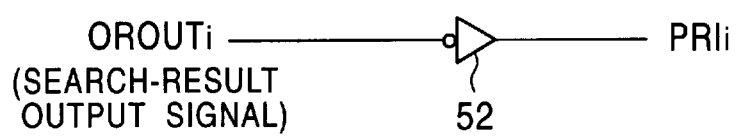
FIG. 7B is a circuit diagram of a conventional output section at an encoder side.

FIG. 7B is a circuit diagram of a conventional output section at an encoder side.

FIG. 7B shows an output section at an encoder side, namely, the search result output of one CAM word, used in a conventional CAM to which a redundant-circuit technique is not applied, in order to make the scale of an additional circuit according to the present invention easier to understand. In FIG. 7B, an inverter 52 corresponds to the tristate inverter 48 shown in the circuit according to the present invention, illustrated in FIG. 7A.

It is clear from a comparison between the circuits shown in FIG. 7A and FIG. 7B that only the inverter 50 constituting the selector 46 is added to obtain the circuit according to the present invention when the circuit section corresponding to the control circuit 24 is shared. This component is added, for example, to the conventional CAM shown in FIG. 8, and its circuit scale is much more smaller and its output delay time is extremely shorter than the circuit shown in FIG. 9, added to the conventional CAM.

As described above, a CAM according to the present invention has a small-scale circuit for converting logical addresses (addresses externally input) into physical addresses (addresses actually used in the inside) and vice versa. In addition, unlike a CAM employing a conventional redundant-circuit technique, a magnitude comparison, an addition, or a subtraction is not performed every time a read/write access to stored data or a search operation is performed. Therefore, a CAM according to the present invention has almost the same output delay time as a conventional CAM not provided with a redundant circuit.

A content addressable memory according to the present invention is basically described above.

A content addressable memory according to the present invention has been descried in detail. The present invention is not limited to the above embodiment. Within the scope and spirit of the present invention, various improvements and modifications can be performed.

For example, in semiconductor memories such as content addressable memories, consecutive defective words are found in many cases. Therefore, such memories may be designed such that spare CAM words more than the consecutive words are provided and the addresses of CAM words can be shifted by the number of the consecutive words.

As described above in detail, in a content addressable memory according to the present invention, the address information of a defective CAM word included in a plurality of CAM words is held, and control is applied in order to replace the defective CAM word with a spare CAM word, according to the address information of the defective CAM word such that the address of the defective CAM word is replaced with that of the spare CAM word and the search match output of the spare CAM word is replaced with that of the defective CAM word.

Consequently, a content addressable memory according to the present invention can be used by replacing a defective CAM word with a spare CAM word without increasing a circuit scale and an output delay time, and can improve a product yield.

What is claimed is:

1. A content addressable memory (CAM) comprising:
   a plurality of CAM words;
   one or more spare CAM word serving as a redundant circuit;
   a defective-CAM-word address storage section for holding information indicating whether there is one or more defective CAM word in the plurality of CAM words, and if there is one or more defective CAM word, address information of the defective CAM word;
   a shift control circuit for controlling such that the addresses of CAM words located at lower-order addresses than the defective CAM word are shifted in a lower-order direction or in an higher-order direction by the use of the spare CAM word, according to the address information of the defective CAM word, held in the defective-CAM-word address storage section;
   a first shift circuit for shifting the addresses of CAM words located at lower-order addresses than i-th (i: integer equal to 1 or more) defective CAM word in the lower-order direction by "i" according to the control of the shift control circuit at a read/write access of data; and
   a second shift circuit for shifting the addresses of the CAM words located at lower-order addresses than the i-th defective CAM word in the higher-order direction by "i" according to the control of the shift control circuit at a search operation.

2. A content addressable memory (CAM) according to claim 1, wherein the shift control circuit comprises a first shift control circuit for controlling the first shift circuit so as to shift the addresses of the CAM words located at lower-order addresses than the defective CAM word in the lower-order direction, and a second shift control circuit for controlling the second shift circuit so as to shift the addresses of the CAM words located at lower-order addresses than the defective CAM word in the higher-order direction.

3. A content addressable memory (CAM) according to claim 1,
   wherein the shift control circuit comprises a unit control circuit corresponding to each of the plurality of CAM words; and
   each unit control circuit receives a defective word selection signal obtained by decoding the address of the defective CAM word, and the output of the foregoing unit control circuit, outputs a shift control signal to the first and second shift circuits, and outputs the inverted signal of the shift control signal to the following unit control circuit.

4. A content addressable memory (CAM) according to claim 3,
   wherein the first shift circuit comprises a selector corresponding to each unit control circuit; and
   each selector receives a plurality of word selection signals output from a row decoder and outputs one of the plurality of word selection signals according to the shift control signal.

5. A content addressable memory (CAM) according to claim 4,
   wherein the second shift circuit comprises a selector corresponding to each unit control circuit; and
   each selector receives a plurality of search result output signals and outputs one of the plurality of search result output signals according to the shift control signal.

6. A content addressable memory (CAM) according to claim 1,
   wherein the defective-CAM-word address storage section holds the address of a defective word located at the highest-order address or at the lowest-order address in a defective CAM block formed of "j" (j: integer equal to two or more) consecutive defective CAM words, and the numeral "j;"
   the first shift circuit shifts the addresses of CAM words located at lower-order addresses than the defective CAM word located at the lowest-order address in the defective CAM block, in the lower-order direction by "j;" and
   the second shift circuit shifts the addresses of the CAM words located at lower-order addresses than the defective CAM word located at the lowest-order address in the defective CAM block, in the higher-order direction by "j."

7. A content addressable memory (CAM) according to claim 1,
   wherein the defective-CAM-word address storage section holds the address of a CAM word located at the highest-order address or at the lowest-order address in a defective CAM block formed of "j" (j: integer equal to two or more) consecutive CAM words, including at least one defective CAM word, and the numeral "j;"
   the first shift circuit shifts the addresses of CAM words located at lower-order addresses than the CAM word located at the lowest-order address in the defective CAM block, in the lower-order direction by "j;" and the second shift circuit shifts the addresses of the CAM words located at lower-order addresses than the CAM word located at the lowest-order address in the defective CAM block, in the higher-order direction by "j."

8. A content addressable memory (CAM) comprising:

a plurality of CAM words;

one or more spare CAM word serving as a redundant circuit;

a defective-CAM-word address storage section for holding information indicating whether there is one or more defective CAM word in the plurality of CAM words, and if there is one or more defective CAM word, address information of the defective CAM word;

a shift control circuit for controlling such that the addresses of CAM words located at higher-order addresses than the defective CAM word are shifted in a higher-order direction or in an lower-order direction by the use of the spare CAM word, according to the address information of the defective CAM word, held in the defective-CAM-word address storage section;

a first shift circuit for shifting the addresses of CAM words located at higher-order addresses than i-th (i: integer equal to 1 or more) defective CAM word in the higher-order direction by "i" according to the control of the shift control circuit at a read/write access of data; and a second shift circuit for shifting the addresses of the CAM words located at higher-order addresses than the i-th defective CAM word in the lower-order direction by "i" according to the control of the shift control circuit at a search operation.

9. A content addressable memory (CAM) according to claim 8, wherein the shift control circuit comprises a first shift control circuit for controlling the first shift circuit so as to shift the addresses of the CAM words located at higher-order addresses than the defective CAM word in the higher-order direction, and a second shift control circuit for controlling the second shift circuit so as to shift the addresses of the CAM words located at higher-order addresses than the defective CAM word in the lower-order direction.

10. A content addressable memory (CAM) according to claim 8, wherein the shift control circuit comprises a unit control circuit corresponding to each of the plurality of CAM words; and each unit control circuit receives a defective word selection signal obtained by decoding the address of the defective CAM word, and the output of the foregoing unit control circuit, outputs a shift control signal to the first and second shift circuits, and outputs the inverted signal of the shift control signal to the following unit control circuit.

11. A content addressable memory (CAM) according to claim 10, wherein the first shift circuit comprises a selector corresponding to each unit control circuit; and each selector receives a plurality of word selection signals output from a row decoder and outputs one of the plurality of word selection signals according to the shift control signal.

12. A content addressable memory (CAM) according to claim 11, wherein the second shift circuit comprises a selector corresponding to each unit control circuit; and each selector receives a plurality of search result output signals and outputs one of the plurality of search result output signals according to the shift control signal.

13. A content addressable memory (CAM) according to claim 8, wherein the defective-CAM-word address storage section holds the address of a defective word located at the lowest-order address or at the highest-order address in a defective CAM block formed of "j" (j: integer equal to two or more) consecutive defective CAM words, and the numeral "j;"

the first shift circuit shifts the addresses of CAM words located at higher-order addresses than the defective CAM word located at the highest-order address in the defective CAM block, in the higher-order direction by "j;" and the second shift circuit shifts the addresses of the CAM words located at higher-order addresses than the defective CAM word located at the highest-order address in the defective CAM block, in the lower-order direction by "j."

14. A content addressable memory (CAM) according to claim 8, wherein the defective-CAM-word address storage section holds the address of a CAM word located at the lowest-order address or at the highest-order address in a defective CAM block formed of "j" (j: integer equal to two or more) consecutive CAM words, including at least one defective CAM word, and the numeral "j;"

the first shift circuit shifts the addresses of CAM words located at higher-order addresses than the defective CAM word located at the highest-order address in the defective CAM block, in the higher-order direction by "j;" and the second shift circuit shifts the addresses of the CAM words located at higher-order addresses than the CAM word located at the highest-order address in the defective CAM block, in the lower-order direction by "j."

* * * * *